(12) United States Patent
Ghoshal

(10) Patent No.: US 12,446,467 B2
(45) Date of Patent: Oct. 14, 2025

(54) THERMOELECTRIC ENERGY HARVESTING APPARATUS SYSTEM AND METHOD

(71) Applicant: Sheetak, Inc., Austin, TX (US)

(72) Inventor: Uttam Ghoshal, Austin, TX (US)

(73) Assignee: Sheetak, Inc., Austin, TX (US)

( * ) Notice: Subject to any disclaimer, the term of this patent is extended or adjusted under 35 U.S.C. 154(b) by 197 days.

(21) Appl. No.: 17/918,560

(22) PCT Filed: Apr. 13, 2021

(86) PCT No.: PCT/US2021/027095
§ 371 (c)(1),
(2) Date: Oct. 12, 2022

(87) PCT Pub. No.: WO2021/211593
PCT Pub. Date: Oct. 21, 2021

(65) Prior Publication Data
US 2023/0138483 A1    May 4, 2023

Related U.S. Application Data

(60) Provisional application No. 63/009,704, filed on Apr. 14, 2020.

(51) Int. Cl.
*H10N 10/17*    (2023.01)
*H10N 10/80*    (2023.01)

(52) U.S. Cl.
CPC ............. *H10N 10/17* (2023.02); *H10N 10/80* (2023.02)

(58) Field of Classification Search
CPC .............................. H10N 10/17; H10N 10/80
See application file for complete search history.

(56) References Cited

U.S. PATENT DOCUMENTS

| 1,120,781 A | 12/1914 | Altenkirch |
| 3,125,860 A | 3/1964 | Reich |
| (Continued) | | |

FOREIGN PATENT DOCUMENTS

| CN | 1154467 A | 7/1997 |
| CN | 1259648 A | 7/2000 |
| (Continued) | | |

OTHER PUBLICATIONS

PCT International Search Report and Written Opinion for International Application No. PCT/US21/27095 dated Jul. 21, 2021 (5 pages).

(Continued)

*Primary Examiner* — Jayne L Mershon
(74) *Attorney, Agent, or Firm* — Clark Hill PLC

(57) ABSTRACT

The present disclosure is related to thermoelectric energy harvesting and powering of Internet-of-Things (IoT) devices and systems. The thermoelectric energy harvesting device includes a thermoelectric converter electrically coupled to voltage rectifier and a power storage medium. The first side of the thermoelectric converter is exposed to ambient air with fluctuating temperatures, while the second side is anchored to a stable temperature. Power generated across the temperature differential can be captured in the power storage medium. The harvester may also include a device to move the harvester relative to the air and, by generating convection cooling of the first side, increase the net energy harvested.

9 Claims, 11 Drawing Sheets

(56) References Cited

U.S. PATENT DOCUMENTS

| | | |
|---|---|---|
| 3,296,034 A | 1/1967 | Reich |
| 3,480,846 A | 11/1969 | Mathes |
| 3,735,806 A | 5/1973 | Kirkpatrick |
| 3,826,957 A | 7/1974 | McLaughlin |
| 3,931,255 A | 1/1976 | Durholz |
| 4,271,681 A | 6/1981 | Schertz |
| 4,288,854 A | 9/1981 | Burroughs |
| 4,322,737 A | 3/1982 | Sliwa |
| 4,448,028 A | 5/1984 | Chao |
| 4,698,541 A | 10/1987 | Bar-Cohen |
| 4,833,889 A | 5/1989 | Harwell |
| 4,971,632 A | 11/1990 | Rowe |
| 5,237,821 A | 8/1993 | Okumura |
| 5,367,879 A | 11/1994 | Doke |
| 5,375,421 A | 12/1994 | Hsieh |
| 5,387,849 A | 2/1995 | Sridharan |
| 5,419,780 A * | 5/1995 | Suski ............... H10N 10/13 136/224 |
| 5,501,076 A | 3/1996 | Sharp |
| 5,579,830 A | 12/1996 | Giammararuti |
| 5,711,155 A | 1/1998 | DeVilbiss |
| 5,737,923 A | 4/1998 | Gilley |
| 5,782,094 A | 7/1998 | Freeman |
| 5,890,371 A | 4/1999 | Rajasubramanian |
| 5,921,087 A | 7/1999 | Bhatia et al. |
| 5,959,341 A | 9/1999 | Tsuno |
| 6,003,319 A | 12/1999 | Gilley |
| 6,084,772 A | 7/2000 | Pell |
| 6,329,721 B1 | 12/2001 | DiGiacomo |
| 6,338,251 B1 | 1/2002 | Ghoshal |
| 6,370,884 B1 | 4/2002 | Kelada |
| 6,492,585 B1 | 12/2002 | Zamboni |
| 6,583,350 B1 | 6/2003 | Gee |
| 6,740,600 B2 | 5/2004 | Ghoshal |
| 7,032,389 B2 | 4/2006 | Cauchy |
| 7,131,286 B2 | 11/2006 | Ghoshal |
| 7,342,169 B2 | 3/2008 | Venkatasubramanian |
| 7,448,222 B2 | 11/2008 | Bormann |
| 8,101,846 B1 | 1/2012 | Schroeder |
| 8,468,837 B2 | 6/2013 | Pinet |
| 9,435,571 B2 | 9/2016 | Ghoshal |
| 9,596,944 B2 | 3/2017 | Tempronics |
| 9,685,599 B2 | 6/2017 | Petrovski |
| 9,842,979 B2 | 12/2017 | Himmer |
| 10,032,975 B2 | 7/2018 | Ghoshal |
| 10,405,667 B2 | 9/2019 | Marquette |
| 10,458,683 B2 | 10/2019 | Edwards |
| 10,905,113 B2 | 2/2021 | Aksan |
| 11,035,807 B2 | 6/2021 | Stautner |
| 11,462,669 B2 | 10/2022 | Ghoshal |
| 11,892,204 B2 | 2/2024 | Ghoshal |
| 2002/0062853 A1 | 5/2002 | Kajihara |
| 2002/0109970 A1* | 8/2002 | Yang ............... H01L 23/3672 257/E23.103 |
| 2003/0029174 A1 | 2/2003 | Lee |
| 2003/0041892 A1 | 3/2003 | Fleurial |
| 2004/0173257 A1 | 9/2004 | Rogers |
| 2005/0016198 A1 | 1/2005 | Wowk |
| 2005/0051208 A1 | 3/2005 | Mount |
| 2005/0126184 A1 | 6/2005 | Cuachy |
| 2005/0150535 A1 | 7/2005 | Samavedam |
| 2005/0150536 A1 | 7/2005 | Ngai |
| 2005/0150537 A1 | 7/2005 | Ghoshal |
| 2005/0210884 A1 | 9/2005 | Tuskiewicz |
| 2005/0274120 A1 | 12/2005 | Quisenberry |
| 2006/0011776 A1 | 1/2006 | Maurer |
| 2006/0076046 A1 | 4/2006 | Ghoshal |
| 2006/0117761 A1 | 6/2006 | Bormann |
| 2006/0137360 A1 | 6/2006 | Ghoshal |
| 2006/0255341 A1 | 11/2006 | Pinnington |
| 2007/0090892 A1 | 4/2007 | Larson |
| 2007/0137687 A1 | 6/2007 | Tanielian |
| 2007/0221266 A1 | 9/2007 | Davies |
| 2007/0251569 A1 | 11/2007 | Shan |
| 2007/0261730 A1 | 11/2007 | Seker |
| 2007/0289622 A1 | 12/2007 | Hecht |
| 2008/0020946 A1 | 1/2008 | Venkatasubramanian |
| 2008/0053509 A1 | 3/2008 | Flitsch |
| 2008/0092937 A1 | 4/2008 | Mitchell et al. |
| 2008/0121263 A1 | 5/2008 | Schutte |
| 2008/0178606 A1 | 7/2008 | Chen |
| 2008/0184710 A1 | 8/2008 | DeVilbiss |
| 2008/0283110 A1 | 11/2008 | Jin |
| 2009/0049845 A1 | 2/2009 | McStravick |
| 2009/0109621 A1 | 4/2009 | Cheng |
| 2009/0322221 A1 | 12/2009 | Makansi |
| 2010/0126555 A1 | 5/2010 | Maxton |
| 2010/0186794 A1 | 7/2010 | Chen |
| 2010/0208498 A1 | 8/2010 | Rubio |
| 2011/0000224 A1 | 1/2011 | Ghoshal |
| 2011/0016886 A1 | 1/2011 | Ghoshal |
| 2012/0073276 A1 | 3/2012 | Meisner |
| 2012/0090534 A1 | 4/2012 | Schroeder |
| 2012/0227926 A1 | 9/2012 | Field |
| 2013/0005372 A1* | 1/2013 | Strei ............... F28D 15/0275 455/500 |
| 2013/0153819 A1 | 6/2013 | Tseng |
| 2014/0137918 A1 | 5/2014 | Zirkle |
| 2014/0251403 A1 | 9/2014 | Ghoshal |
| 2015/0013740 A1 | 1/2015 | Kaibe |
| 2015/0155413 A1 | 6/2015 | Ghoshal |
| 2015/0159924 A1* | 6/2015 | Calderon ............ F25D 11/006 62/3.6 |
| 2015/0280097 A1 | 10/2015 | Jinushi et al. |
| 2015/0325773 A1 | 11/2015 | Ghoshal |
| 2016/0178252 A1 | 6/2016 | Nakamura |
| 2016/0372650 A1 | 12/2016 | Ghoshal |
| 2017/0219256 A1 | 8/2017 | Friend et al. |
| 2017/0256696 A1* | 9/2017 | Colinge ............ H10N 19/101 |
| 2018/0337321 A1 | 11/2018 | Ghoshal |
| 2018/0366629 A1 | 12/2018 | Ghoshal |
| 2021/0144960 A1* | 5/2021 | Taneja ................ A01K 7/027 |
| 2022/0384703 A1 | 12/2022 | Ghoshal |

FOREIGN PATENT DOCUMENTS

| | | |
|---|---|---|
| CN | 1478307 A | 2/2004 |
| CN | 1680766 A | 10/2005 |
| CN | 1845316 A | 10/2006 |
| JP | 2003343986 A | 12/2003 |
| JP | 2007178043 A | 7/2007 |
| JP | WO2011104772 * | 9/2011 |
| WO | 2002047176 A2 | 6/2002 |
| WO | 2006119305 A2 | 11/2006 |
| WO | 2009111008 A1 | 9/2009 |
| WO | 2011008280 A1 | 1/2011 |
| WO | 2017216797 A1 | 12/2017 |
| WO | 2021211593 A1 | 10/2021 |
| WO | 2022109114 A1 | 5/2022 |

OTHER PUBLICATIONS

European Search Report for European Application No. 17918560 dated Mar. 3, 2024.
B.J. O'Brien, C. S. Wallace, and K. Landecker, "Cascading of Peltier Couples for Thermoelectric Cooling*", Journal of Applied Physics, vol. 27, No. 7, Jul. 1956, (4 pages).
"Heat Control Filters" (2001). Newport Corporation.
Written Opinion of the International Search Authority for International Application No. PCT/US2009/001542, dated May 9, 2009 (application's corresponding PCT applicatin) (5 pages).
International Search Report from the International Searching Authority Korea (US) for International Application No. PCT/US10/01981 (our matter 0102PCT) mailed Sep. 15, 2010, corresponding to U.S. Appl. No. 13/496,291, published as US2012-0192574 AI on Aug. 2, 2012 (our matter 0102US) (2 pages).
Notification of the First Office Action dated Dec. 22, 2011, State Intellectual Property Office of People's Republic of China; Chinese National Phase of PCT Application No. PCT/US2009/001542, with English translation (11 pages).
Notification of First Office Action from the State Intellectual Property Office of P.R.C. mailed Mar. 28, 2012 corresponding to Chinese

(56) References Cited

OTHER PUBLICATIONS patent application Serial No. 200980107943.1 (our matter 0104CN) (15 pages), with English translation (19 pages); national phase application of PCT No. PCT/US2009/001348.
PCT International Search Report for International Application No. PCT/ US2012/060498 (our matter No. 0105PCT) mailed Jan. 2, 2013 (2 pages).
PCT International Search Report for International Application No. PCT/US18/23140 dated May 30, 2018 (2 pages).
PCT Written Opinion of the International Searching Authority for International Application No. PCT/US18/23140 dated May 30, 2018 (23 pages).
PCT International Search Report for International Application No. PCT/US18/57400 dated Jan. 11, 2019 (2 pages).
PCT Written Opinion of the International Searching Authority for International Application No. PCT/US18/57400 dated Jan. 11, 2019 (6 pages).
PCT International Preliminary Report on Patentability for International Application No. PCT/US18/23140 issued Sep. 17, 2019 (16 pages).
Examination Report for India App. No. 202017034922 dated May 9, 2022.
Patent Cooperation Treaty International Search Report and Written Opinion mailed Feb. 4, 2022, International Application No. PCT/US21/59858 (5 pages).
Patent Cooperation Treaty International Search Report and Written Opinion mailed Feb. 4, 2022, International Application No. PCT/US21/59858 (17 pages).
PCT International Search Report for International Application No. PCT/US22/51351 dated May 3, 2023 (5 pages).
PCT Written Opinion of the International Searching Authority for International Application No. PCT/US22/51351 dated May 3, 2023 (5 pages).

\* cited by examiner

THERMOELECTRIC ENERGY HARVESTING APPARATUS SYSTEM AND METHOD

BACKGROUND OF THE DISCLOSURE

1. Field of the Disclosure

The present disclosure relates to apparatuses and systems of battery-free thermoelectric devices, and, in particular, energy harvesters for Internet of Things sensors.

2. Description of the Related Art

Electronic sensors have been in use for decades, relaying information to data collectors and hubs in commercial and residential applications. While early sensors obtained power to transmit their data by wired connections, later sensors were remote and had their own power storage and transmitted data wirelessly. Embedded sensors with wireless capability are fundamental to the Internet of Things (IoT) technology.

While millions of remote sensors reduced the cost and bulk of hardware required for installation, maintenance was increased by the need to change out the power storage devices (i.e. batteries) on a periodic basis. One solution to the battery changing dilemma was the use of photovoltaic cells to power the sensors via sunlight.

A shortcoming in prior art sensors is the need to have energy storage devices replaced on a regular basis. Another shortcoming in some prior art sensors is that they need exposure to a radiant light power source, such as the sun, and, thus, cannot be used in placed in areas where visible light is low or absent.

What are needed are thermoelectric energy harvesting devices that can power sensors and do not require changing of the energy storage devices.

BRIEF SUMMARY OF THE DISCLOSURE

In aspects, the present disclosure is related to an apparatus and system for supplying energy to low power devices, and, in particular, thermoelectric energy harvesters that eliminate the need or greatly reduce the need for replacing energy storage batteries.

One embodiment according to the present disclosure includes a thermoelectric energy harvesting apparatus, the apparatus including a thermoelectric converter with a temperature differential between a first side and a second side of the thermoelectric converter; a heat sink in thermal communication with the first side and ambient air; a plurality of heat fins in thermal communication with the heat sink and the ambient air; a base plate in thermal communication with the second side; a power management component comprising an energy storage medium in electrical communication with the thermoelectric converter; and an air mover electrically coupled to the power management component to direct air flow at the plurality of heat fins. The apparatus may also include a voltage rectified electrically disposed between the thermoelectric converter and the power management component. The apparatus may also include a power feedback loop configured to adjust the power to the air mover based on an increase in power generated by the thermoelectric converter. The apparatus may also include a heat exchanger disposed between at least two adjacent heat fins of the plurality of heat fins, wherein the heat exchanger surface is substantially parallel to the direct air flow. The heat exchanger may be corrugated in shape.

Another embodiment according to the present disclosure includes a thermoelectric sensor system, the system that includes: a thermoelectric energy harvester including a thermoelectric converter with a temperature differential between a first side and a second side of the thermoelectric converter; a heat sink in thermal communication with the first side and ambient air; a plurality of heat fins in thermal communication with the heat sink and the ambient air; a base plate in thermal communication with the second side; a power management component comprising an energy storage medium in electrical communication with the thermoelectric converter; and an air mover electrically coupled to the power management component to direct air flow at the plurality of heat fins; a sensor electrically connected to the power management component; and a wireless transmitter electrically connected to the sensor. In some embodiments, the wireless transmitter may be configured to communicate with the Internet or another computer network.

Another embodiment according to the present disclosure is a method of harvesting electrical energy, the method including the steps of: generating electrical power using a thermoelectric energy harvester; storing the electrical power; moving ambient air or the thermoelectric energy harvester relative to the other using the stored electrical power. The method may also include a step to adjusting the stored electrical power used based on an increase in electrical power generated using the thermoelectric energy harvester. Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein.

DETAILED DESCRIPTION OF THE DISCLOSURE

Figure 1:
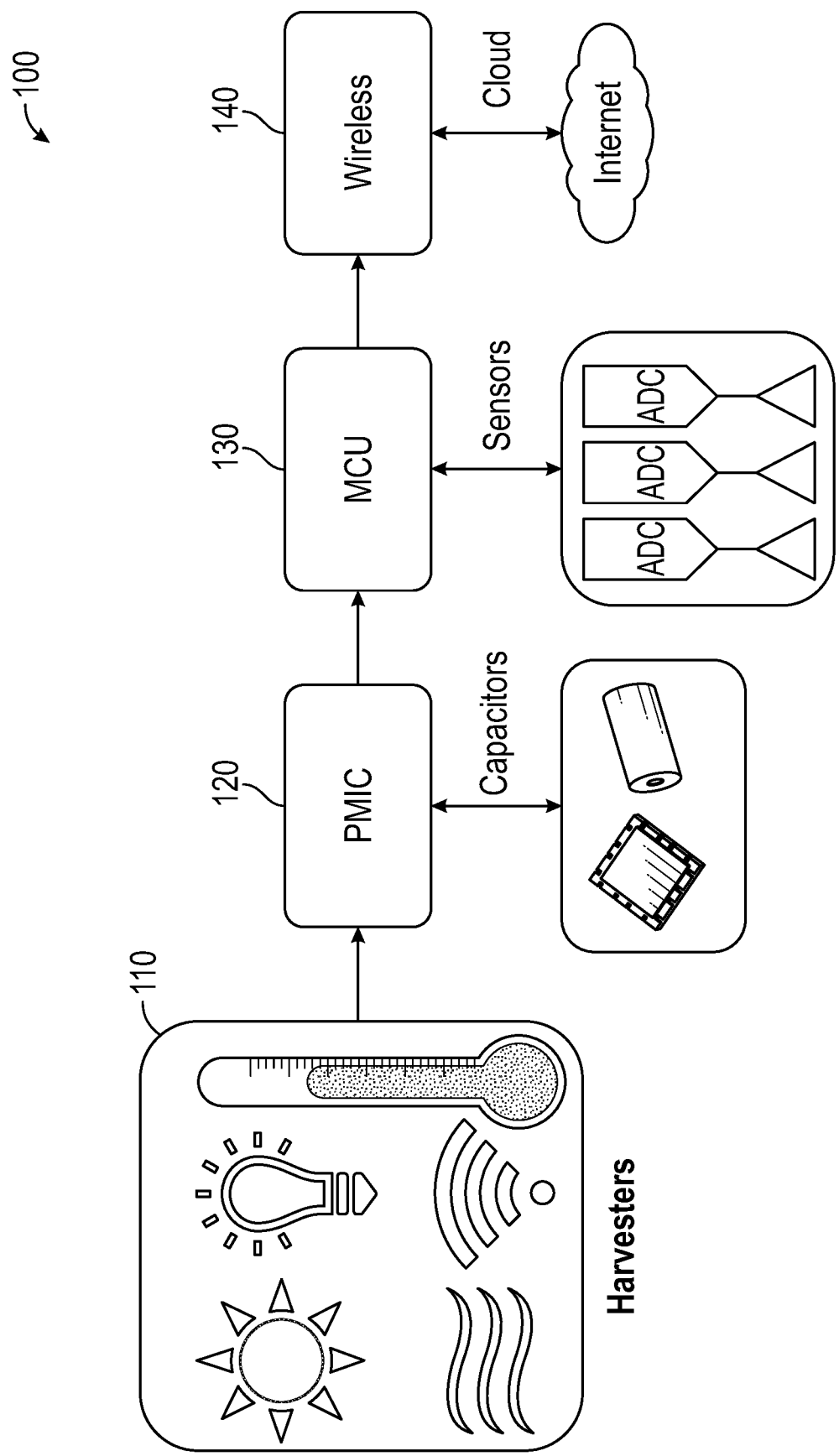
FIG. 1 is a diagram of a thermoelectric wireless sensor system according to one embodiment of the present disclosure.

Generally, the present disclosure relates to apparatuses and systems for transmitting data while powered through the conversion of heat energy to electrical energy, and, in particular, transmitting data using energy derived from temperature differentials and storing that energy in an energy storage medium that does not require regular access for changing out power cells. The present disclosure is susceptible to embodiments of different forms. They are shown in the drawings, and herein will be described in detail, specific embodiments of the present disclosure with the understanding that the present disclosure is to be considered an exemplification of the principles of the present disclosure and is not intended to limit the present disclosure to that illustrated and described herein.

FIG. 1 shows a diagram of a thermoelectric wireless sensor system 100. The system 100 includes a thermoelectric energy harvester 110, a power management component 120, a microcontroller unit (MCU) and sensor 130, and a wireless transmitter 140. The thermoelectric energy harvester 110 includes a thermoelectric device with a first side and a second side (discussed later) and generates electrical power from a temperature differential in the ambient air and electrically communicates this power to the power management component 120. The power management component 120 may include an energy storage device, such as an electrolytic capacitor, supercapacitor, a power management integrated circuit (PMIC), or a rechargeable battery, that is suitable to store energy from the thermoelectric energy harvester 110. The power management component 120 may include a circuit for switching between charging and discharging modes. The power management component 120 may discharge energy to the microcontroller 130, which may include one or more sensors that are configured to detect one or more parameters of interest and convert sensor inputs into data that can be transmitted. The parameters of interest can be any measurable characteristic or property, including, but not limited to, temperature, magnetic field strength, sound frequency, light intensity, chemical composition, humidity. A person of skill in the art would recognize that anything that can be sensed can have its sensor used with the system 100. The microcontroller with sensor 130 communicates its data to the wireless transmitter 140, which converts the electrical signal into an electromagnetic signal that can be detected by a suitable receiver at a location remote to the system 100. The wireless transmitter 140 may communicate information from the microcontroller with sensor 130 to any wireless receiver, including the receivers connected to the Internet or local routers or networks. In some embodiments, one or more systems 100 may be part of an IoT system, whereby the separate systems 100 may communicate via the Internet, whether local or remote, with other devices or one another.

Figure 2A:
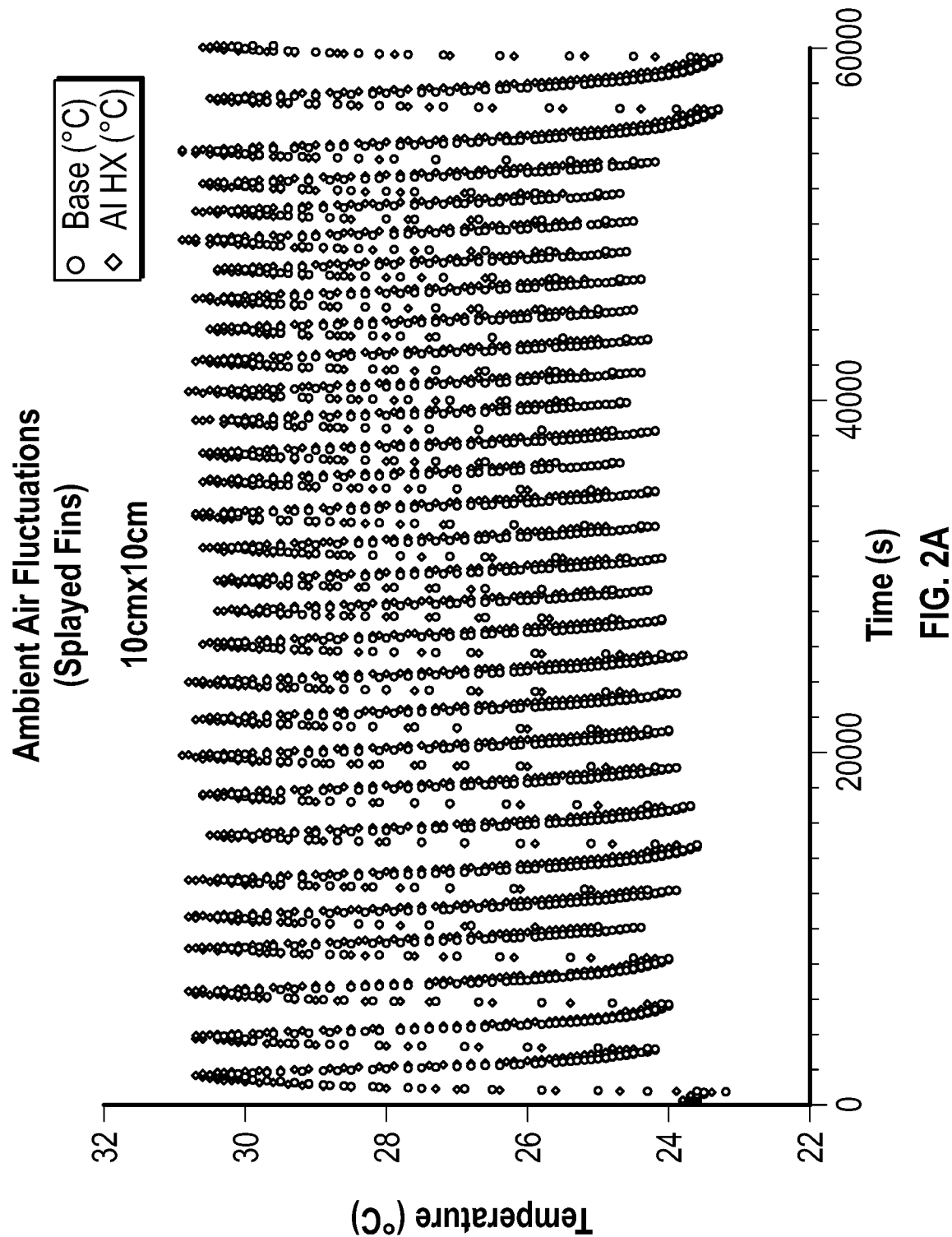
FIG. 2A is a graph of ambient air temperature fluctuations on the first side of the thermoelectric converter of the thermoelectric wireless sensor of FIG. 1.
Figure 2B:
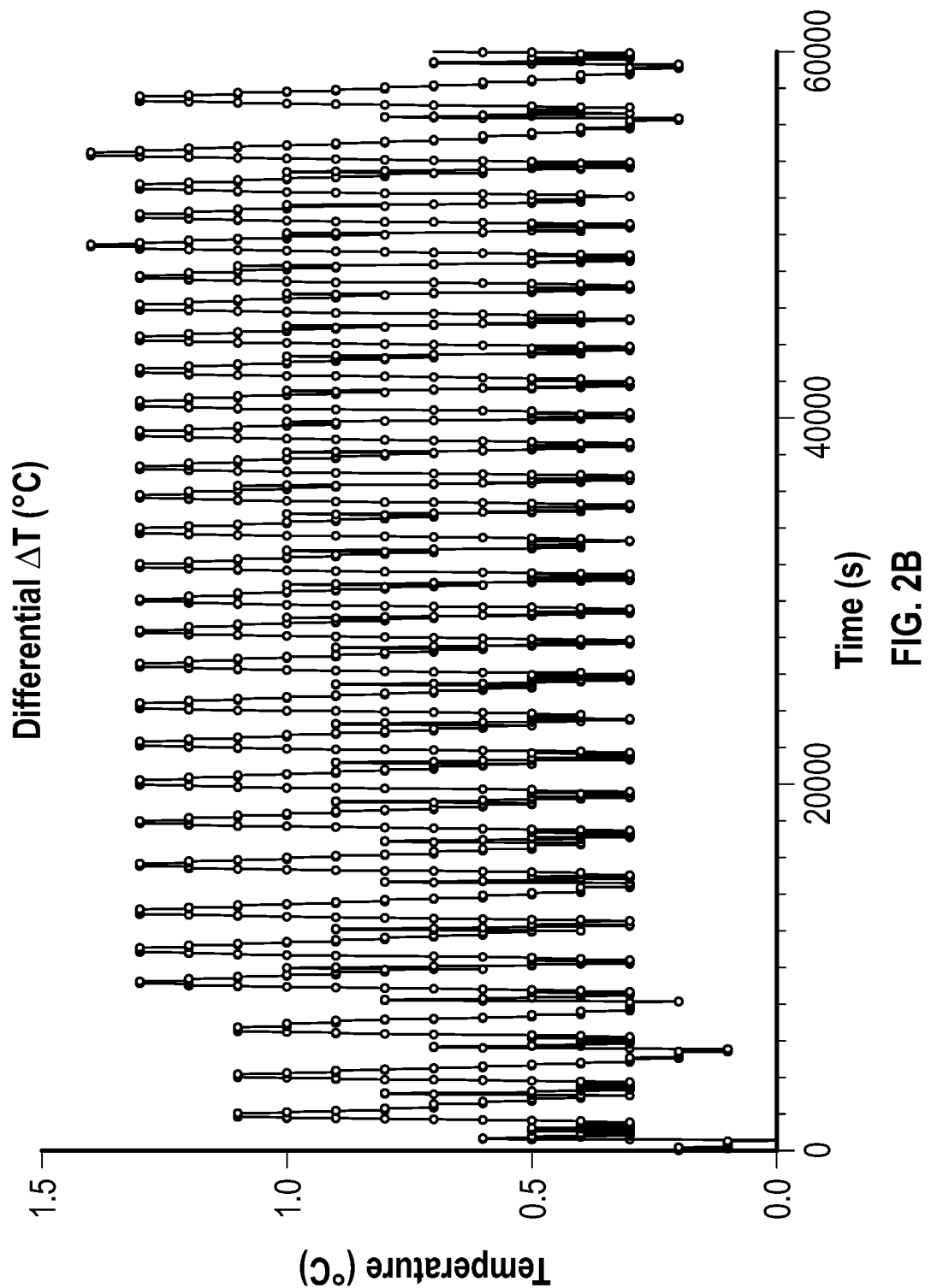
FIG. 2B is a graph of temperature differentials across the thermoelectric converter of the thermoelectric wireless sensor of FIG. 1.

FIG. 2A shows a graph of ambient air temperature fluctuations on the first side of the thermoelectric energy harvester. In this exemplary and non-limiting instance, the temperature fluctuates between about 24 degrees Celsius and 31 degrees Celsius. In some embodiments, the ambient air temperature may be lower or much higher (over 1000 degrees Celsius). These temperature fluctuations tend to be quicker than the changes in the temperature of the second side of the thermoelectric energy harvester 110. As a result of the difference in the speed of temperature fluctuations between the first side and the second side, a temperature differential between the two sides is created, as shown the graph in FIG. 2B.

Figure 2C:
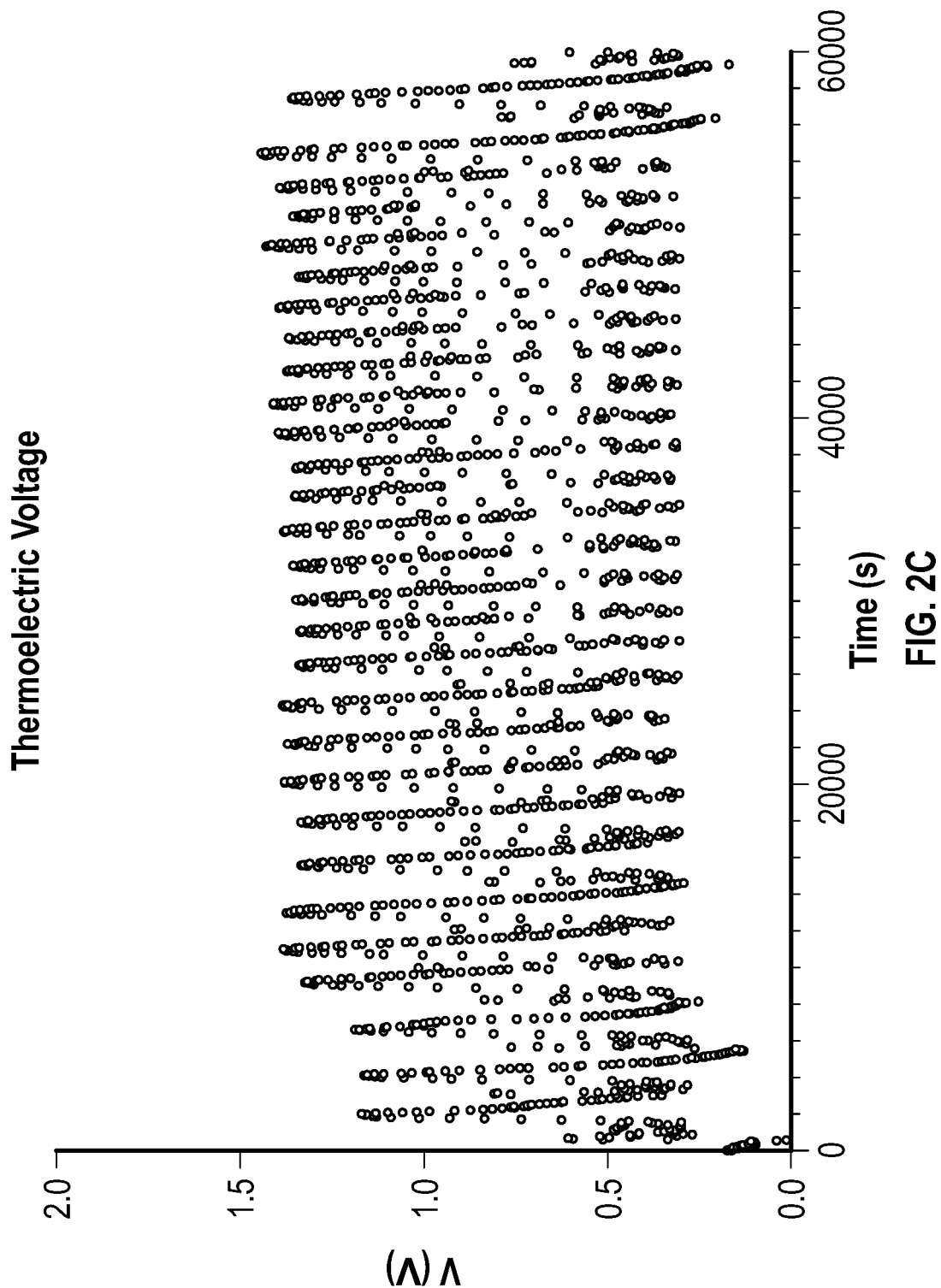
FIG. 2C is a graph of the voltages produced by the thermoelectric converter of the thermoelectric wireless sensor of FIG. 1.
Figure 2D:
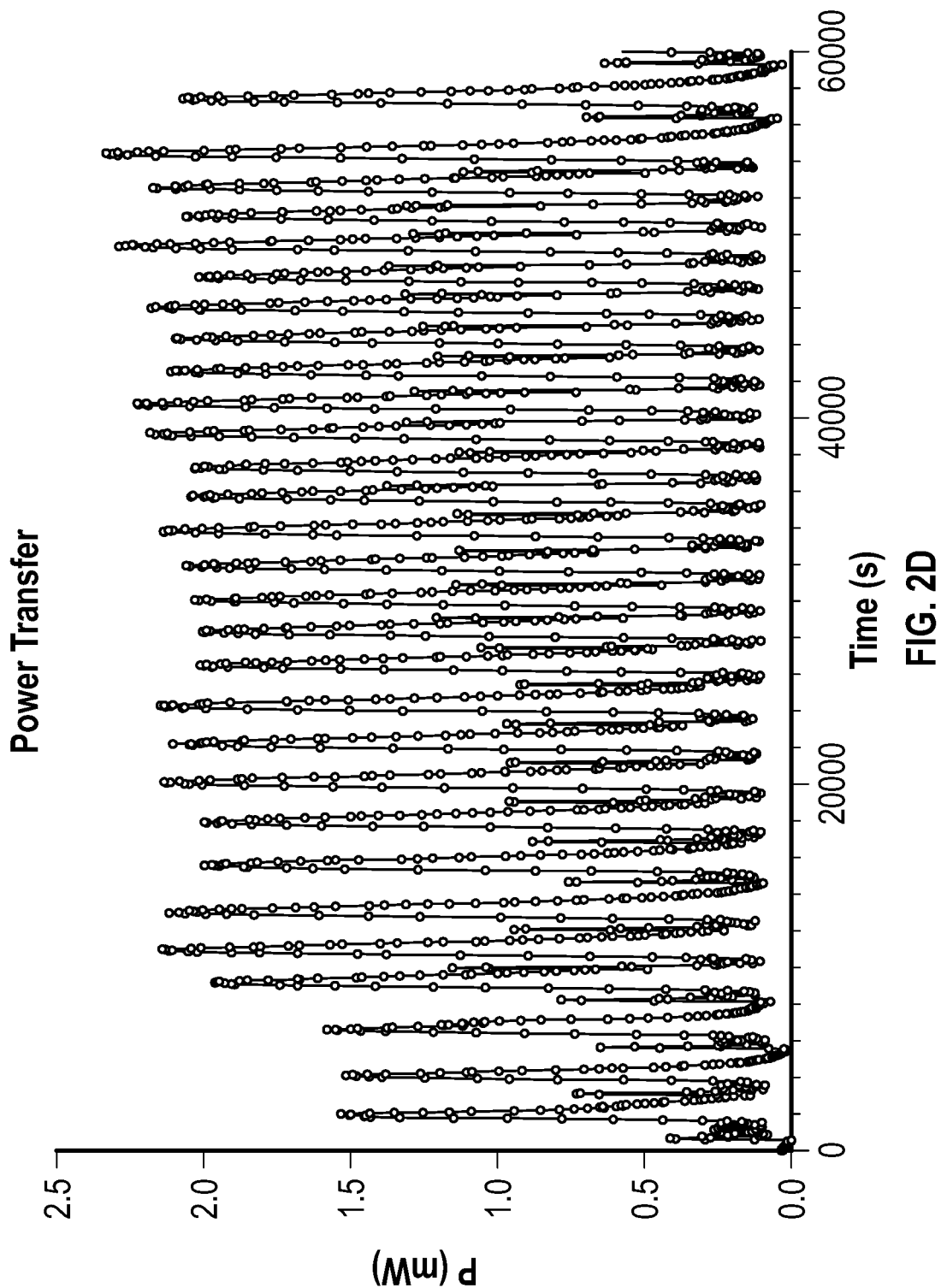
FIG. 2D is a graph of the power transferred by the thermoelectric converter to the energy storage of the thermoelectric wireless sensor of FIG. 1.

FIG. 2C shows a graph of the voltage generated by the thermoelectric energy harvester 110 due to the temperature differential between the first side and the second side. FIG. 2D shows a graph of the power transferred to the power management component 120 due to the voltage generated by the thermoelectric energy harvester 110.

Figure 3:
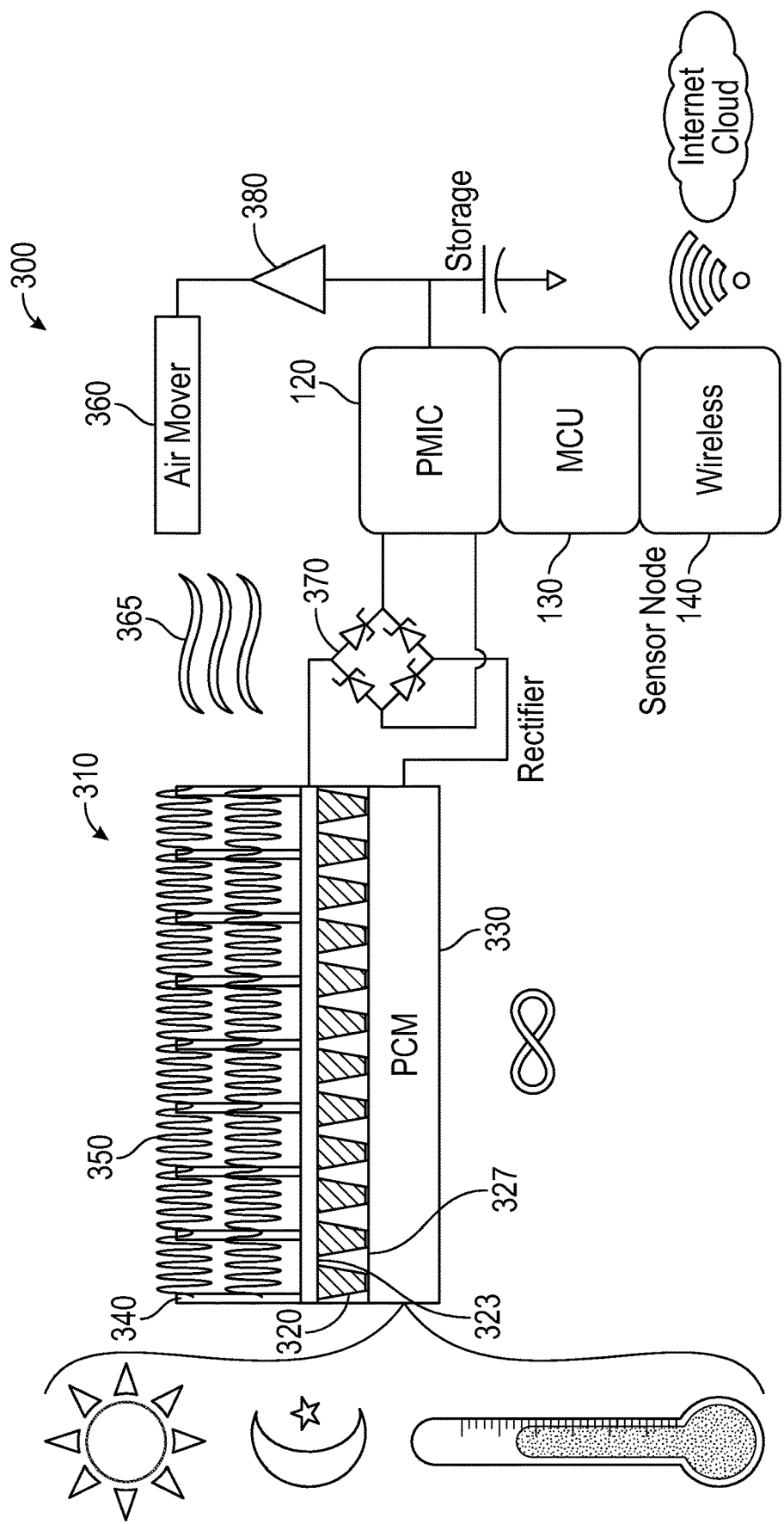
FIG. 3 is another embodiment of a thermoelectric wireless sensor system according to one embodiment of the present disclosure.

FIG. 3 shows another embodiment of a thermoelectric wireless sensor system 300. The system 300 includes a thermoelectric energy harvester 300, the power management component 120, the microcontroller (with sensor) 130, and the wireless transmitter 140. The thermoelectric energy harvester 300 may include a thermoelectric converter 320 with a first side 323 and a second side 327. In some embodiments, monolithically integrated thermoelectric converters implemented as arrays of thermoelectric couples to form the thermoelectric converter 320. In some embodiments, thermoelectric converter 320 may be selected based on the desired operating temperature and/or temperature difference expected across the thermoelectric converter 320 as shown in Table 1.

TABLE 1

| Operating temperature range | Thermoelement materials |
| --- | --- |
| −50° C. to 150° C. | Bi—Sb—Te—Se chalcogenides, Mg—Bi—Si, In—Sb, Organic (PANi/graphene-PEDOT:PSS/PANi/DWNT-PEDOT), Heusler materials Fe—V—W—Al |
| 150-400° C. | Pb—Te—Se, Sn—Se, Zn—Sb, Ba—Yb—CoSb3, Ce—Fe—CoSb3 |
| 400-1000° C. | Si—Ge—C, Zintls such as Yb—Mn—Sb, rare-earth tellurides La—Te and Pr—Te |

The second side 327 is in thermal communication with a base plate 330. The base plate 330 may be made of or include a phase change material (PCM). In some embodiments, the base plate 330 may be made of a metal. A plurality of heat fins 340 may be in thermal communication with the first side 323 and the ambient air. One or more thin heat exchangers 350 may be disposed between adjacent heat fins 340. The thin heat exchangers 350 may be made of a thin metallic foil or other heat conducting material. The thin heat exchanger 350 increases the surface area for dispersing heat into the ambient air beyond what could be done with only the heat fins 340. In some embodiments, the thin heat exchangers 350 may be loosely folded multiple times between adjacent heat fins 340, forming an even larger surface area contact with the ambient air. While the heat fins 340 are disposed perpendicularly or substantially perpendicular to the first side 327, the thin heat exchangers 350 may be disposed parallel to or substantially parallel to the first side 327. Thus, the heat exchangers 350, while loosely folded or corrugated, may be in physical communication with and generally perpendicular to the heat fins 340. The system 300 includes an air mover 360 configured to cause air movement in the form of pulses or wavelets 365 or otherwise disturbs laminar air flow. The air mover 360 is disposed such that the wavelets 365 travel across the surfaces of the thin heat exchangers 350 and the heat fins 340 to maximize the removal of heat to the ambient air. The thermoelectric converter 320 produces an electric voltage when there is a temperature differential across the thermoelectric converter 320. The temperature differential may be positive or negative depending on whether the first side is hotter or colder than the second side, resulting in a positive or negative voltage produced by the thermoelectric converter 320. This voltage may be rectified by a voltage rectifier 370 such that the electrical energy flows into the power management component 120 for storage. Power from the power management component 120 may pass through a feedback controller circuit 380 and be used to power the air mover 360. The feedback controller circuit 380 may be configured to drive the air mover 360 up to a power level where there is still a net gain in power being received by the power management component 120.

Figure 4:
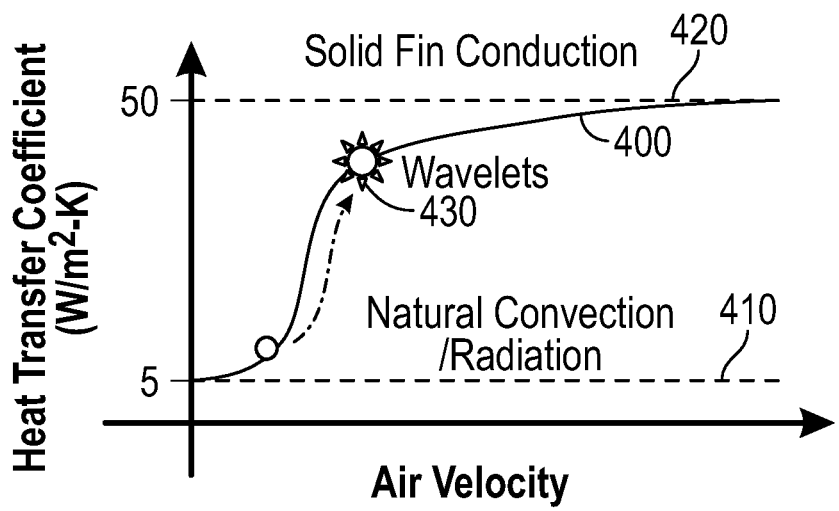
FIG. 4 is a graph of the heat transfer of the thermoelectric converter of FIG. 3 relative to air movement.

FIG. 4 shows a graph of the heat transfer of the thermoelectric converter 320 and how it changes as the air wavelets 365 remove heat from the heat fins 340 and thin heat exchangers 350. The curve 400 shows the increase in the heat transfer coefficient as the air speed across the heat fins 340 and/or thin heat exchangers 350 increases and improves heat convection. When the heat transfer coefficient increases, more power is produced by the thermoelectric converter 320, and this increase can be more than the amount of power required to drive the air mover 360 along certain parts of the curve 400. The line 410 shows the heat transfer coefficient when the air movement is zero or still, so the only removal of heat is due to thermal radiation or natural convection based on density gradients in the ambient air. The line 420 shows the limit of the heat convection, where the heat transfer coefficient is limited by solid fin efficiency and will not increase even if the air speed across the heat fins 340 and/or heat exchangers 350 is increased. The shape of the curve 400 indicates that there is at least one point of maximized increase power gained due to increasing the heat transfer coefficient relative to the power consumed by the air mover 360 to move the air to realize that gain the heat transfer coefficient. That point is marked as point 430 along the curve 400. As can be seen, the presence of the air wavelets can increase the heat transfer coefficient between 5 to 10 times the value present without air flow.

Figure 5A:
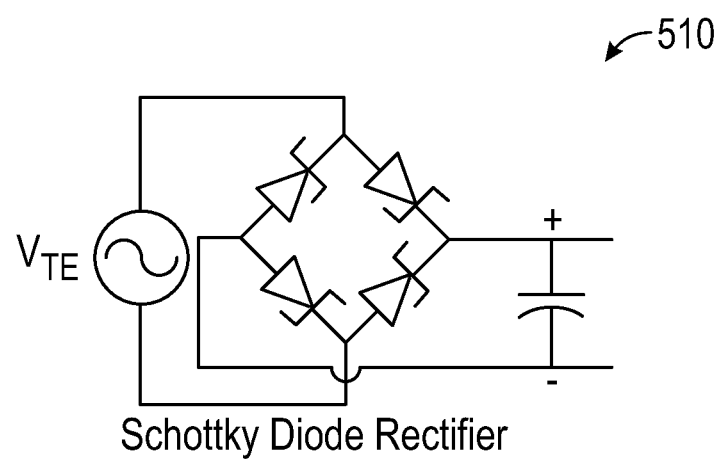
FIG. 5A is a diagram a rectifier for use in the thermoelectric wireless sensor system of FIG. 3.
Figure 5B:
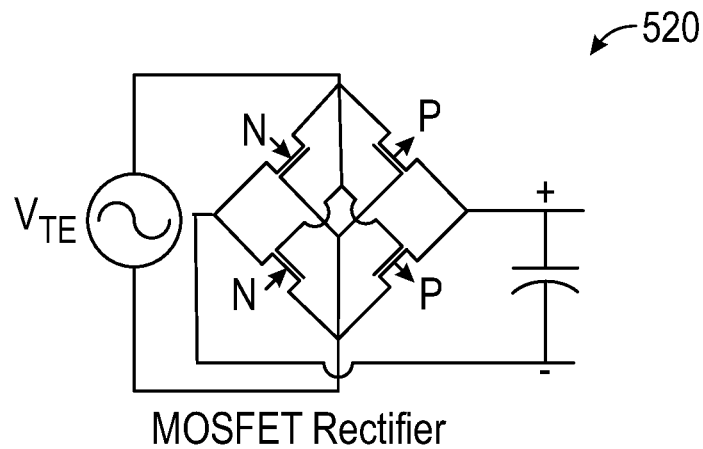
FIG. 5B is a diagram of another rectifier for use in the thermoelectric wireless sensor system of FIG. 3.

FIGS. 5A-5B show suitable circuit diagrams for low-voltage rectifier configurations for the voltage rectifier 370. FIG. 5A shows a circuit diagram of a Schottky diode rectifier 510, and FIG. 5B shows a circuit diagram of a MOSFET rectifier 520. These rectifier configurations are illustrative and exemplary only, as a person of skill in the art could use any voltage regulator configuration that can rectify the output voltage of the thermoelectric converter 320 based on its individual characteristics and environment.

Figure 6A:
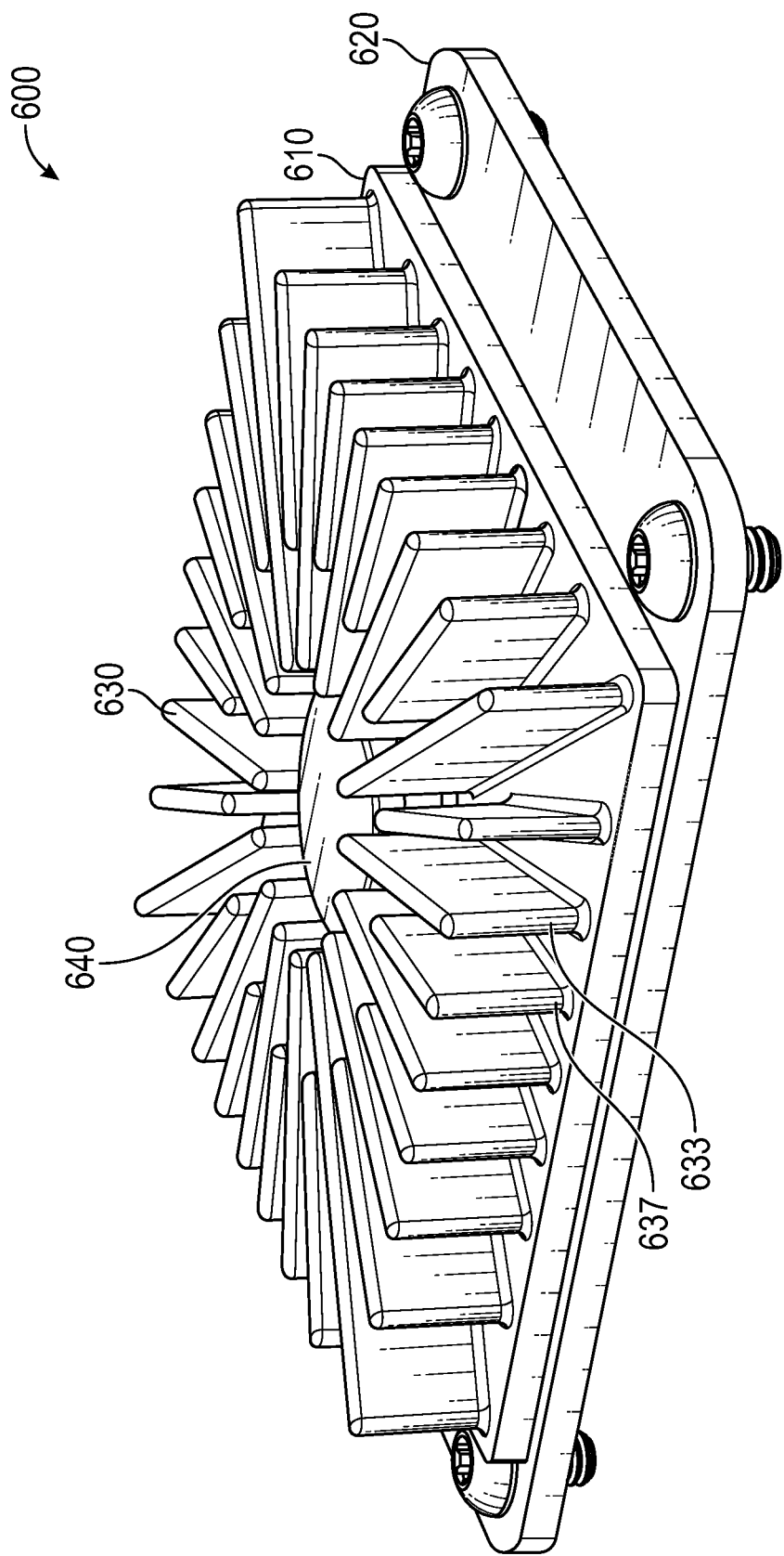
FIG. 6A is a picture of a thermoelectric energy harvester with air mover and heat exchangers according to another embodiment of the present disclosure.
Figure 6B:
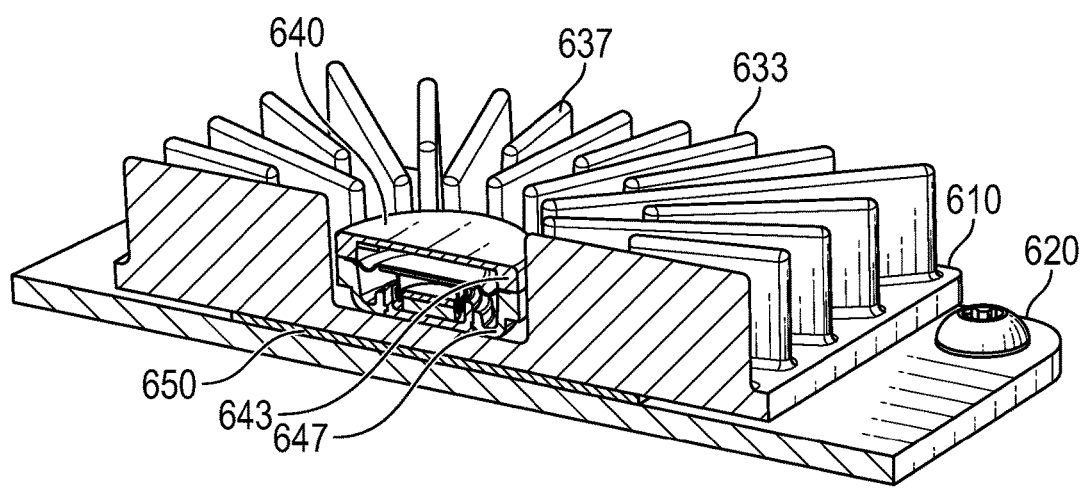
FIG. 6B is a cross-section view of the thermoelectric energy harvester of FIG. 6A.
Figure 6C:
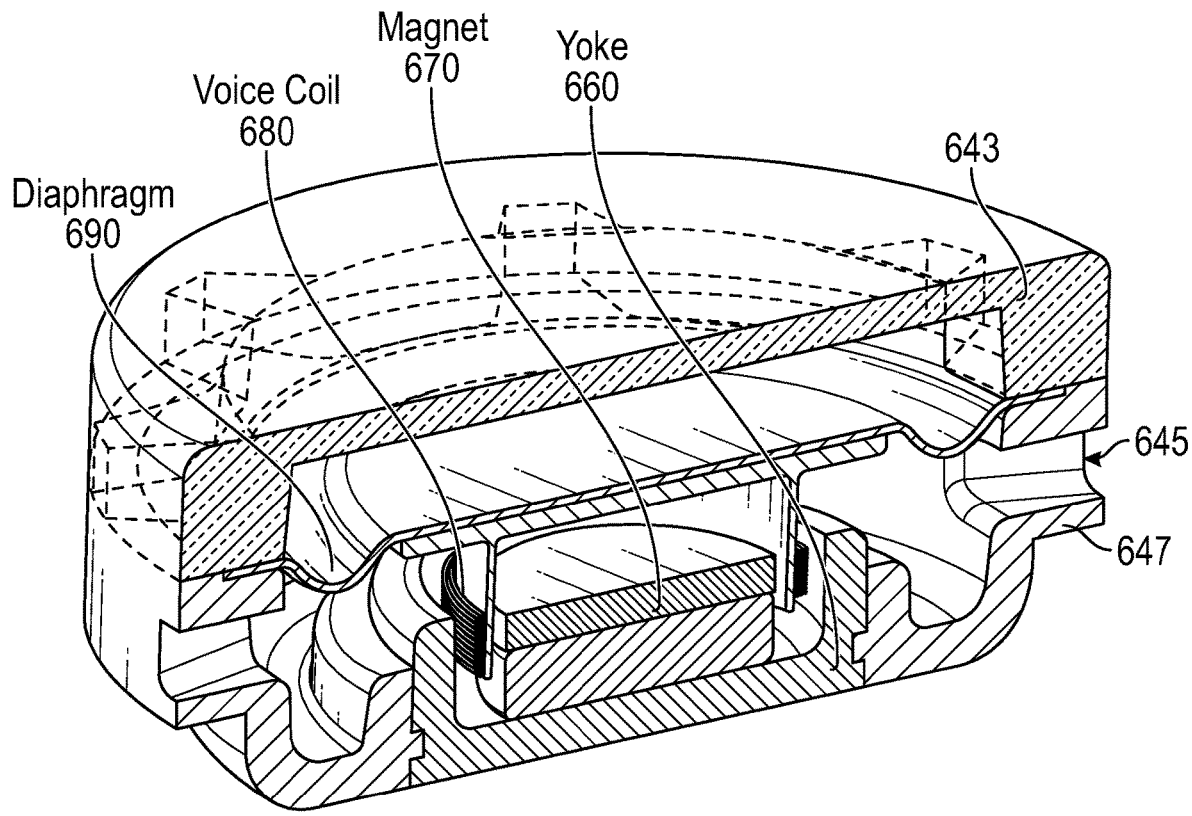
FIG. 6C is a cross-section view of the air mover in the thermoelectric energy harvester of FIG.

FIGS. 6A-6C show aspects of a thermoelectric energy harvester 600 that may be used in the system 100 or the system 300. FIG. 6A shows the exterior of the thermoelectric energy harvester 600 including a heat sink 610 that is disposed above a base plate 620. The base plate 620 may be made of a heat conductive material. In some embodiments, the base plate 620 may be made of or embedded with a PCM. Heat fins 630 may be disposed on the heat sink 610. The heat fins 630 may be perpendicular or substantially perpendicular to the heat sink 610 in order to maximize the air flow between the heat fins 630. The heat fins 630 may be long fins 633 extending from an air mover 640 or short fins 637 disposed between the long fins 633 and further from the air mover 640. In some embodiments, the short fins 637 are optional.

FIG. 6B shows a cross-section of the thermoelectric energy harvester 600. A thermoelectric converter 650 is disposed between the heat sink 610 and the base plate 620. The air mover 640 may include a divided housing with an upper portion 643 and a lower portion 647.

FIG. 6C shows a cross-section of the air mover 640. The air mover 640 may include a yoke 660 that supports a permanent magnet 670. Proximate to the magnet 670 is a voice coil 680 that can be induced to vibrate by a magnetic field generated by the magnet 680. The voice coil 680 receives power from the power management component 120 through the feedback control circuit 380. The voice coil 680 is in physical communication with a diaphragm 690. The electrical currents in the voice coil 680 creates a fluctuating magnetic force on the voice coil 680 that in turn lifts the diaphragm 690. The physical movement of the lifting and falling of the diaphragm 690 causes wavelets 365 of air to move in an out of the housing formed by upper portion 643 and lower portion 647. The upper portion 643 and the lower portion 647 are configured to provide a channel 645 for air to move in and out of the air mover 640 when the voice coil 680 vibrates. The voice coil 680 may be any suitable galvanometer-like actuator that converts a magnetic field into vibrational energy as would be understood by a person of ordinary skill in the art.

Figure 7A:
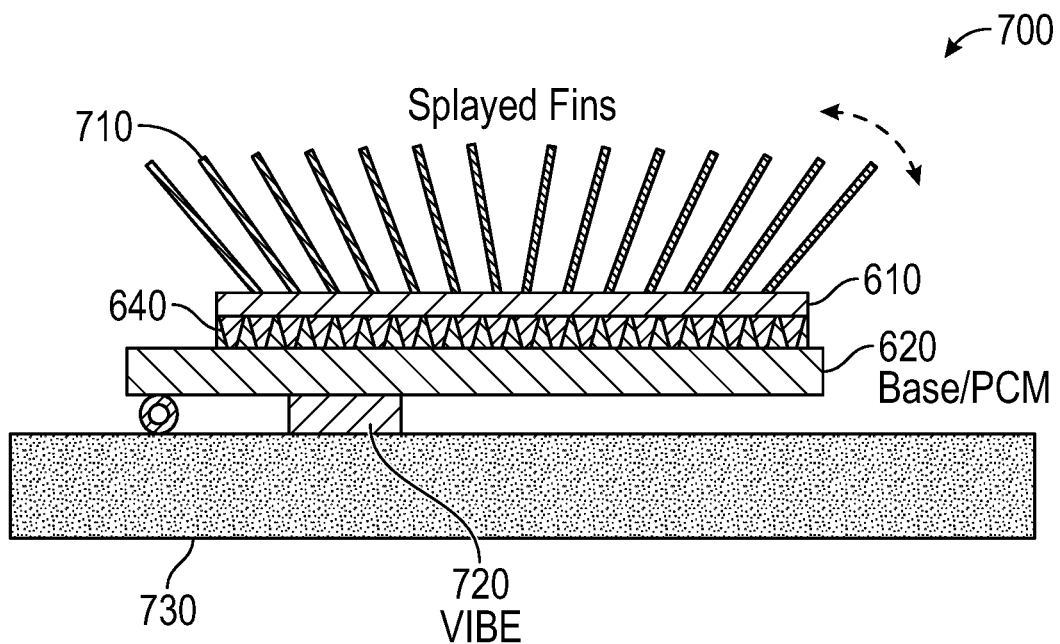
FIG. 7A is a diagram of another embodiment of a thermoelectric energy harvester using vibrators to move the heat exchanger relative to the air according to one embodiment of the present disclosure.
Figure 7B:
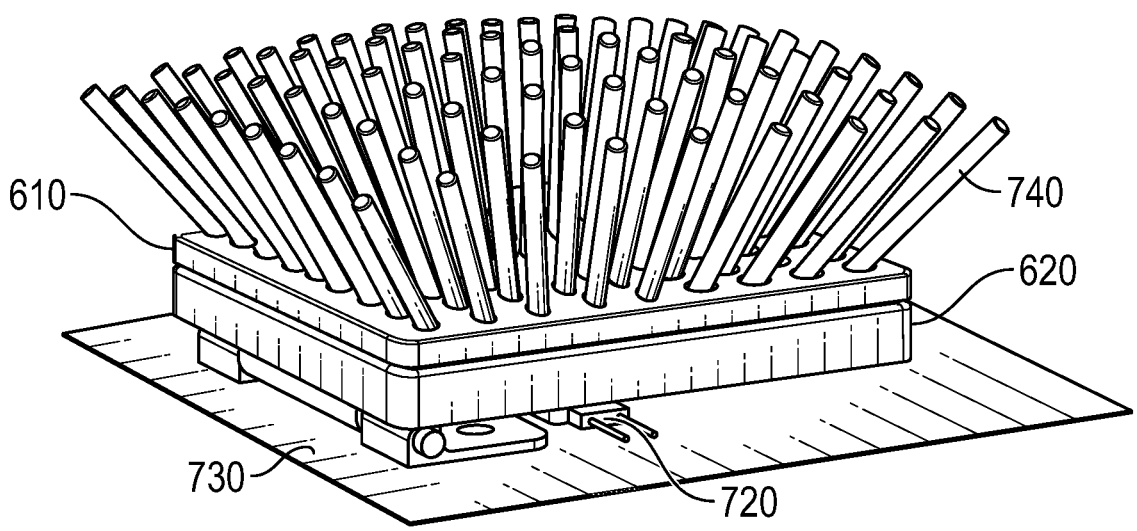
FIG. 7B is a picture of an alternative heat exchanger array a thermoelectric energy harvester according to another embodiment of the present disclosure.

FIGS. 7A-7B shown an alternative embodiment 700 based on moving the heat fins relative to the air rather than the air relative to the heat fins. FIG. 7A shows a diagram of a thermoelectric energy harvester 700 that may be used with system 100. The thermoelectric energy harvester 700 may include the heat sink 610 with heat fins 710. The heat fins 710 may be splayed as to radiate outward from the center of the heat sink 610 or perpendicular to the surface of the heat sink 610. The heat sink 610 is attached to the ambient side of the thermoelectric converter 640 while the base plate 620 is on the other side. In physical communication with the base plate 620 are one or more vibrators 720. The vibrators 720 may be, but are not limited to, vibration motors and linear resonant actuators or piezoelectric transducers. In some embodiments, the vibrators 720 may be disposed between the base plate 620 and a lower surface 730. The vibrators 720 are configured to transfer vibrational energy into the base plate 620 and, through the thermoelectric converter 640 and heat skin 610, into the heat fins 710. The movement of the heat fins 710 relative to the ambient air results in convection cooling of the heat fins 710. The thermoelectric converter 640 produces an electric voltage when there is a temperature difference across the thermoelectric converter 640. FIG. 7B shows an alternative version of the heat fins 710. The heat pin-fin spikes 740 may be attached to the heat 610 and radiate outward not as fins but as spikes, allowing the air to move around as well as across the heat pin-fin spikes 740.

Figure 8:
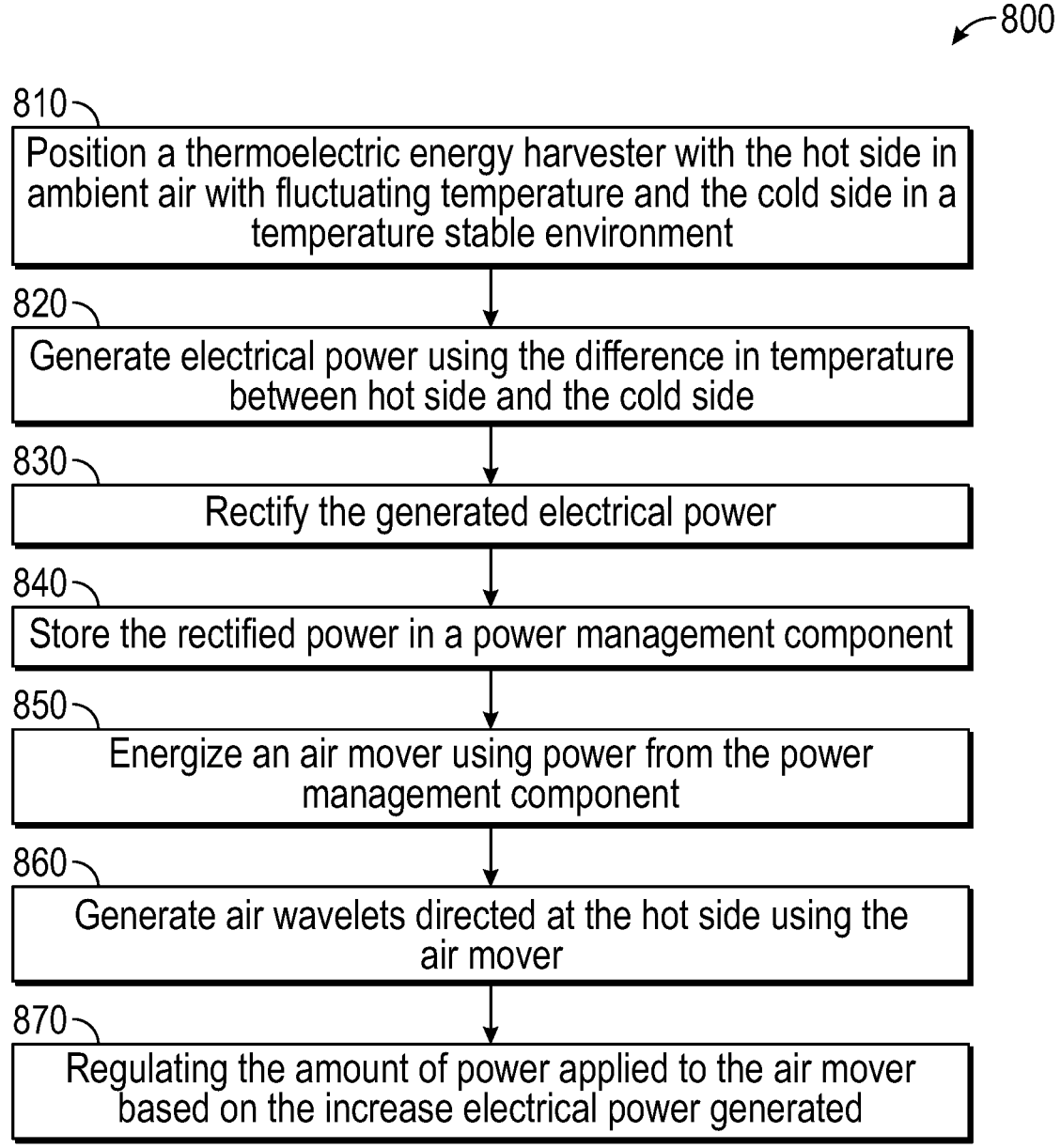
FIG. 8 is a flow chart of a method for generating electrical energy using a thermoelectric energy harvester according to one embodiment of the present disclosure.

FIG. 8 shows a method 800 of harvesting energy using a temperature differential. In step 810, the thermoelectric energy harvester 310, 600, 700 is positioned with a first side in ambient air with fluctuating temperature while the second side is in a stable temperature environment. In step 820 the thermoelectric converter 320 produces electrical power based on a difference in temperature between the first side 323 and the second side 327. In step 830, the electrical power is rectified by the voltage rectifier 370. In step 840 the rectified power is stored in the power management component 120. In step 850, power from the power management component 120 is directed to an air mover 360. In step 860, the air mover 360 generates air wavelets directed at the first side 623 of the thermoelectric converter 620. In step 870, the power applied to the air mover 360 is regulated based on the increase of power generated by the thermoelectric converter 620.

While the disclosure has been described with reference to exemplary embodiments, it will be understood that various changes may be made and equivalents may be substituted for elements thereof without departing from the scope of the disclosure. In addition, many modifications will be appreciated to adapt a particular instrument, situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A thermoelectric energy harvesting apparatus, the apparatus comprising:
    a thermoelectric converter with a temperature differential between a first side and a second side of the thermoelectric converter;
    a heat sink in thermal communication with the first side and ambient air;
    a plurality of heat fins in thermal communication with the heat sink and the ambient air;
    a base plate in direct contact with the second side, wherein the base plate comprises a phase change material;
    a power management component comprising an energy storage medium in electrical communication with the thermoelectric converter; and
    a pulsed air source electrically coupled to the power management component to direct air flow at the plurality of heat fins.

2. The apparatus of claim 1, further comprising a voltage rectifier electrically disposed between the thermoelectric converter and the power management component.

3. The apparatus of claim 2, wherein the voltage rectifier comprises four Schottky diodes.

4. The apparatus of claim 2, wherein the voltage rectifier is configured to allow power to flow when the first side has a higher temperature than the second side and when the first side has a lower temperature than the second side.

5. The apparatus of claim 1, further comprising, a power feedback loop configured to adjust the power to the air mover based on an increase in power generated by the thermoelectric converter.

6. The apparatus of claim 1, further comprising a heat exchanger disposed between at least two adjacent heat fins of the plurality of heat fins, wherein the heat exchanger surface is substantially parallel to the direct air flow.

7. The apparatus of claim 6, where the heat exchanger has a corrugated shape.

8. The apparatus of claim 1, further comprising:
    a sensor electrically connected to the power management component; and
    a wireless transmitter electrically connected to the sensor.

9. The system of claim 8, where the wireless transmitter is configured to communicate with the Internet.

* * * * *